US009362078B2

(12) United States Patent
Perkins

(10) Patent No.: US 9,362,078 B2
(45) Date of Patent: *Jun. 7, 2016

(54) ION SOURCE USING FIELD EMITTER ARRAY CATHODE AND ELECTROMAGNETIC CONFINEMENT

(71) Applicant: Luke Perkins, Plainsboro, NJ (US)

(72) Inventor: Luke Perkins, Plainsboro, NJ (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/728,964

(22) Filed: Dec. 27, 2012

(65) Prior Publication Data

US 2014/0184074 A1 Jul. 3, 2014

(51) Int. Cl.
H01J 7/24 (2006.01)
H01J 27/04 (2006.01)
H01J 37/08 (2006.01)
H05H 3/06 (2006.01)

(52) U.S. Cl.
CPC ............. H01J 27/04 (2013.01); H01J 37/08 (2013.01); H05H 3/06 (2013.01); H01J 2237/082 (2013.01)

(58) Field of Classification Search
USPC ...................... 315/111.81, 111.91
See application file for complete search history.

(56) References Cited

U.S. PATENT DOCUMENTS

| 3,246,191 | A | 4/1966 | Frentrop |
| 3,393,316 | A | 7/1968 | Carr |
| 3,566,185 | A | 2/1971 | Gavin |
| 3,756,682 | A | 9/1973 | Frentrop |
| 3,970,887 | A | 7/1976 | Smith et al. |
| 4,141,405 | A | 2/1979 | Spindt |
| 4,288,696 | A * | 9/1981 | Peelman .................. H05H 3/06 376/109 |
| 4,311,912 | A | 1/1982 | Givens |
| 4,714,860 | A | 12/1987 | Brown et al. |

(Continued)

FOREIGN PATENT DOCUMENTS

| WO | 2009070535 A1 | 6/2009 |
| WO | 2009076291 A1 | 6/2009 |

OTHER PUBLICATIONS

International Search Report and the Written Opinion issued in PCT/US2013/074293 on Mar. 20, 2014; 7 pages.

(Continued)

Primary Examiner — Douglas W Owens
Assistant Examiner — Srinivas Sathiraju
(74) Attorney, Agent, or Firm — Michael Dae

(57) ABSTRACT

An ion source for use in a radiation generator tube includes a back passive cathode electrode, a passive anode electrode downstream of the back passive cathode electrode, a magnet adjacent the anode, and a front passive cathode electrode downstream of the passive anode electrode. The front passive cathode electrode and the back passive cathode electrode define an ionization region therebetween. At least one field emitter array (FEA) cathode is configured to electrostatically discharge due to an electric field in the ion source. The back passive cathode electrode and the passive anode electrode, and the front passive cathode electrode and the passive anode electrode, have respective voltage differences therebetween, and the magnet generating a magnetic field, such that a Penning-type trap is produced to confine electrons from the electrostatic discharge to the ionization region. At least some of the electrons in the ionization region interact with an ionizable gas to create ions.

20 Claims, 13 Drawing Sheets

(56) References Cited

U.S. PATENT DOCUMENTS

| | | | |
|---|---|---|---|
| 4,771,168 A | 9/1988 | Gundersen et al. | |
| 4,996,017 A | 2/1991 | Ethridge et al. | |
| 5,070,282 A | 12/1991 | Epsztein | |
| 5,293,410 A | 3/1994 | Chen et al. | |
| 5,477,046 A | 12/1995 | Dietrich et al. | |
| 5,747,815 A | 5/1998 | Young et al. | |
| 5,773,921 A | 6/1998 | Keesmann et al. | |
| 6,116,975 A | 9/2000 | Saito et al. | |
| 6,236,054 B1 | 5/2001 | Barna et al. | |
| 6,297,507 B1 * | 10/2001 | Chen | G01V 5/08 250/269.1 |
| 6,362,574 B1 * | 3/2002 | Aguero | B64G 1/54 244/171.7 |
| 6,495,953 B1 | 12/2002 | Imura | |
| 6,617,587 B2 * | 9/2003 | Parker | B82Y 10/00 250/396 R |
| 6,734,433 B1 | 5/2004 | Meunier et al. | |
| 6,803,569 B2 | 10/2004 | Tsybin et al. | |
| 6,975,072 B2 * | 12/2005 | Leung | H01J 27/18 118/723 R |
| 7,041,973 B2 | 5/2006 | Schlüter | |
| 7,064,493 B2 | 6/2006 | Konishi | |
| 7,170,223 B2 | 1/2007 | Smith et al. | |
| 7,342,988 B2 * | 3/2008 | Leung | H05H 3/06 376/108 |
| 7,352,187 B2 | 4/2008 | Knapp et al. | |
| 7,362,842 B2 * | 4/2008 | Leung | G21B 3/00 250/423 R |
| 7,521,851 B2 | 4/2009 | Tolt | |
| 7,741,852 B2 | 6/2010 | Watanabe et al. | |
| 7,978,804 B2 | 7/2011 | Groves et al. | |
| 8,080,930 B2 | 12/2011 | King et al. | |
| 8,686,733 B2 | 4/2014 | Brucker et al. | |
| 2003/0025431 A1 | 2/2003 | Pehrsson et al. | |
| 2003/0141787 A1 | 7/2003 | Pelrine et al. | |
| 2004/0026628 A1 | 2/2004 | Schweikhard et al. | |
| 2004/0046491 A1 | 3/2004 | Piehl | |
| 2004/0256556 A1 | 12/2004 | Winkler et al. | |
| 2006/0192494 A1 | 8/2006 | Mastroianni et al. | |
| 2007/0237281 A1 * | 10/2007 | Yakovlyev | H05H 3/06 376/157 |
| 2009/0096460 A1 | 4/2009 | Watanabe et al. | |
| 2009/0135982 A1 | 5/2009 | Groves | |
| 2009/0146052 A1 | 6/2009 | Groves et al. | |
| 2009/0153015 A1 | 6/2009 | King | |
| 2010/0084549 A1 | 4/2010 | Ermakov et al. | |
| 2011/0169492 A1 * | 7/2011 | Groves | H05H 3/06 324/333 |
| 2011/0180698 A1 | 7/2011 | Stephenson | |
| 2011/0210242 A1 | 9/2011 | Bateman et al. | |
| 2011/0278448 A1 | 11/2011 | Syrstad et al. | |
| 2013/0170592 A1 | 7/2013 | Zhou et al. | |

OTHER PUBLICATIONS

International Search Report and the Written Opinion issued in PCT/US2013/075307 on Mar. 27, 2014; 7 pages.

Chichester, et al., "Development of a field desorption ion source for neutron generator applications", Nuclear Instruments and Methods in Physics Research B, vol. 261, doi:10.10161j.nimb2007.04.105, 2007, pp. 835-838.

* cited by examiner

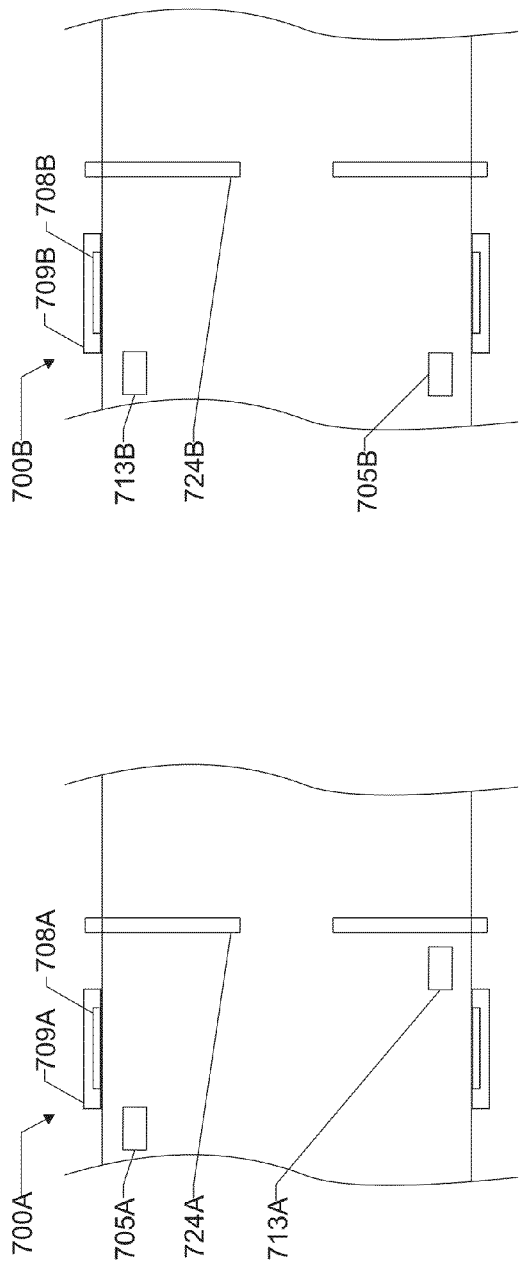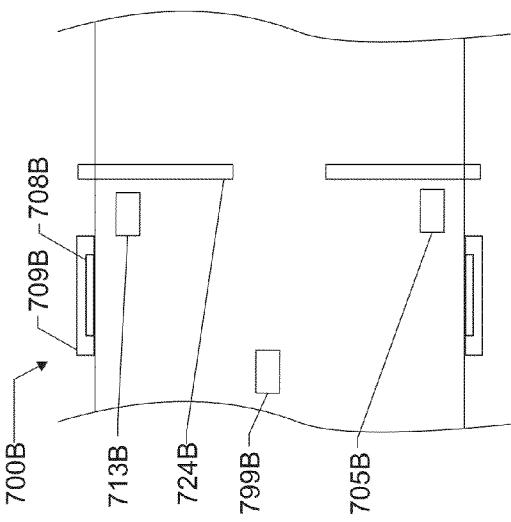

ION SOURCE USING FIELD EMITTER ARRAY CATHODE AND ELECTROMAGNETIC CONFINEMENT

FIELD OF THE DISCLOSURE

The present disclosure is related to the field of ion sources, and, more particularly, to ion sources for use in particle accelerators and/or radiation generators.

BACKGROUND

Well logging instruments that utilize radiation generators, such as sealed-tube neutron generators, have proven incredibly useful in formation evaluation. Such a neutron generator may include an ion source or ionizer and a target. An electric field, which is applied within the neutron tube, accelerates the ions generated by the ion source toward an appropriate target at a speed sufficient such that, when the ions are stopped by the target, fusion neutrons are generated and irradiate the formation into which the neutron generator is placed. The neutrons interact with elements in the formation, and those interactions can be detected and analyzed in order to determine characteristics of interest about the formation.

The generation of more neutrons for a given time period is desirable since it may allow an increase in the amount of information collected about the formation. Since the number of neutrons generated is related to, among other, the number of ions accelerated into the target, ion generators that generate additional ions are desirable. In addition, power can be a concern, so increases in ionization efficiency can be useful; this is desirable because power is often limited in well logging applications.

As such, further advances in the area of ion sources for neutron generators are of interest. It is desired for such ion sources to generate a larger number of ions than present ion sources for a given power consumption.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An ion source for use in a radiation generator tube may include a back passive cathode electrode, a passive anode electrode downstream of the back passive cathode electrode, a magnet adjacent the anode, and a front passive cathode electrode downstream of the passive anode electrode. The front passive cathode electrode and the back passive cathode electrode may define an ionization region therebetween. At least one field emitter array (FEA) cathode may be configured to electrostatically discharge due to an electric field in the ion source. The back passive cathode electrode and the passive anode electrode, and the front passive cathode electrode and the passive anode electrode, may have respective voltage differences therebetween, and the magnet may generate a magnetic field, such that a Penning-type trap is produced to confine electrons from the electrostatic discharge to the ionization region. At least some of the electrons in the ionization region interact with an ionizable gas to create ions.

Another aspect is directed to a well logging instrument. The well logging instrument may have a sonde housing, and a radiation generator tube carried by the sonde housing. The radiation generator tube may include an ion source. The ion source may have a back passive cathode electrode, a passive anode electrode downstream of the back passive cathode electrode, a magnet adjacent the anode, and a front passive cathode electrode downstream of the passive anode electrode. The front passive cathode electrode and the back passive cathode electrode may define an ionization region therebetween. At least one field emitter array (FEA) cathode may be configured to electrostatically discharge due to an electric field in the ion source. The back passive cathode electrode and the passive anode electrode, and the front passive cathode electrode and the passive anode electrode, may have respective voltage differences therebetween, and the magnet may generate a magnetic field, such that a Penning-type trap is produced to confine electrons from the electrostatic discharge to the ionization region. At least some of the electrons in the ionization region may interact with an ionizable gas to create ions. In addition, there may be a suppressor electrode downstream of the ion source, and a target downstream of the suppressor electrode. The suppressor electrode may have a potential such that a resultant electric field between the front passive cathode electrode and suppressor electrode accelerates the ions generated by the ion source toward the target.

A further aspect is directed to an ion source for use in a radiation generator that may include a gas reservoir to emit an ionizable gas, at least one cathode to emit electrons, and a penning device to confine the electrons in a penning-style trap. At least some of the electrons in the penning-style trap may interact with the ionizable gas to thereby generate ions.

A method aspect is directed to a method of operating an ion source having a back passive cathode electrode, a passive anode electrode downstream of the back passive cathode electrode, a magnet adjacent the anode, and a front passive cathode electrode downstream of the anode. The method may include generating an electric field such that the at least one FEA cathode electrostatically discharges, and producing a Penning-type trap to confine the electrons to the ionization region by generating respective voltage differences between the back passive cathode electrode and the passive anode electrode, and the front passive cathode electrode and the anode, and by generating a magnetic field with the magnet. The method may further include generating ions via interactions between at least some of the electrons and an ionizable gas as the electrons travel in the ionization region.

BRIEF DESCRIPTION OF THE DRAWINGS

FIGS. 7-7C are simplified schematic cross-sectional views of other alternative configurations of the ion sources disclosed herein.

DETAILED DESCRIPTION

One or more embodiments of the present disclosure will be described below. These described embodiments are only examples of the presently disclosed techniques. Additionally, in an effort to provide a concise description, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill in the art having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. In FIGS. 1-8, elements separated by century are similar, although it should be understood that this does not apply to FIG. 9.

For clarity in descriptions, when the term "downstream" is used, a direction toward the target of a radiation generator tube is meant, and when the term "upstream" is used, a direction away from the target of a radiation generator tube is meant. Similarly, the term "front" is used to denote a passive cathode electrode structure that is closer to the target of a radiation generator tube than a passive cathode electrode described by the term "back." "Interior" is used to denote a component carried within the sealed envelope of a radiation generator tube, while "exterior" is used to denote a component carried outside of the sealed envelope of a radiation generator tube. An "active" cathode is used to describe a cathode which is designed to emit electrons, while a "passive" cathode is used to describe a cathode electrode structure which merely has a negative polarity. In addition, it should be understood that when active cathodes are shown as mounted to passive cathodes, they are at a same or similar potential.

Figure 1:
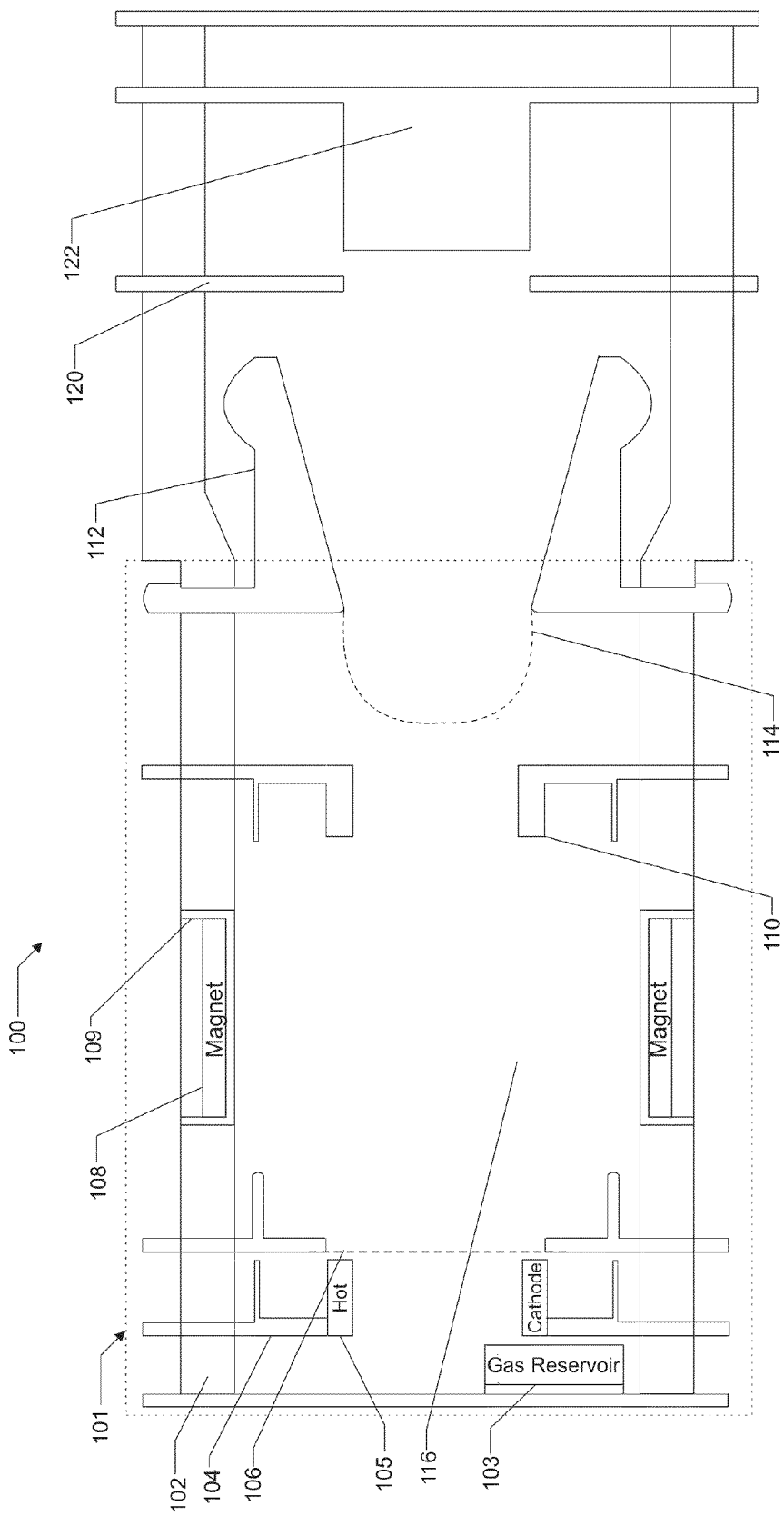
FIG. 1 is a schematic cutaway view of a radiation generator tube employing an ion source with an ohmically heated cathode in accordance with the present disclosure.

An ion source 101 for use in a radiation generator tube 100 is now described with reference to FIG. 1. The ion source 101 includes a portion of a hermetically sealed envelope, with one or more insulator(s) 102 forming a part of the hermetically sealed envelope. The insulator 102 may be an insulator constructed from ceramic material, such as $Al_2O_3$. At least one ionizable gas, such as deuterium or tritium, is contained within the hermetically sealed envelope at a pressure of 1 mTorr to 20 mTorr, for example. A gas reservoir 103 stores and supplies this gas and can be used to adjust this gas pressure. It should be understood that the gas reservoir 103 may be located anywhere in the ion source 101 and need not be positioned as in the figures. In fact, the gas reservoir 103 may be positioned outside of the ion source 101, downstream of the extractor electrode 112.

The ion source 101 includes a back passive cathode electrode 104 downstream of the gas reservoir 103. This back passive cathode electrode 104 may be constructed from Kovar™, or other comparably suitable materials, according to, among other, brazing and magnetic considerations. The back passive cathode electrode 104 carries an active cathode that is an ohmically heated cathode 105. As shown, the ohmically heated cathode 105 is a ring centered about the longitudinal axis of the ion source 101, as this may help to reduce exposure to backstreaming electrons. It should be understood that the ohmically heated cathode 105 may take other shapes.

An optional cathode grid 106 (shown as being optional in FIG. 1B) is downstream of the ohmically heated cathode 105. A passive cylindrical or axisymmetric anode electrode 109 is downstream of the cathode grid 106, and may be carried within a depression in the insulator 102 as shown. The anode 109 may be constructed from stainless steel or other suitable materials. A magnet 108 is carried within a depression in the anode 109, although it should be understood that the magnet 108 may be carried within the insulator 102 itself at any depth, or on an interior surface of the insulator, or on an exterior surface. The magnet 108 may be shaped as a cylindrical half shell, and may be a permanent magnet, such as a rare-earth magnet, or may be an electromagnet. The magnet 108 is configured such that the magnetic field produced thereby points along the longitudinal axis of the ion source 101.

A front passive cathode electrode 110 is downstream of the anode 109, and may be constructed from nickel, Kovar™, or other suitable materials.

An extractor electrode 112 is downstream of the front passive cathode electrode 110, and an (optional) dome screen 114 extends across an opening defined by the extractor electrode 112. As will be explained, the area bordered by the back passive cathode electrode 104, anode 109, and front passive cathode electrode 110 defines an ionization region 116.

During operation of the ion source 101, the ohmically heated cathode 105 emits electrons via thermionic emission. There is a voltage difference between the cathode 105 and the cathode grid 106 such that electrons emitted by the cathode are accelerated through the cathode grid. The voltage difference may have an absolute value of up to 300V, for example with the cathode 105 being at +5V and the cathode grid being between +50V and +300V.

There is (also) a voltage difference between the back passive cathode electrode 104 and the anode electrode 109 such that a resultant electric field is directed mostly downstream along the longitudinal access of the ion source 101 and toward the extractor electrode 112, and thus accelerates the electrons downstream toward the extractor electrode at an energy sufficient to ionize hydrogen but also sufficient for the electrons the reach sufficiently into the ionization region (which is permeated by both magnetic and electric fields). This voltage difference may have an absolute value of up to 500V for example, with the back passive cathode electrode 104 being at or near ground, and with the anode being at +500V. Since this voltage is on the order of hundreds of volts, as opposed to thousands of volts as used in conventional Penning ion sources, sputtering, which is detrimental to the performance of the neutron generator tube, is reduced.

The electrons as they travel from the back passive cathode electrode 104 to the front passive cathode electrode 110 are attracted toward the anode electrode 109. However, the magnet 108 generates a magnetic field pointing mostly downstream in the same direction as the electric field, such that the electrons are prevented from traveling directly to the anode electrode, and instead are confined to orbits about lines of the magnetic field, travelling back and forth in the electrostatic potential well created by this Penning anode-cathode configuration. Thus, rather than following a relatively straight trajectory as they travel, the electrons travel along a spiral or helical shaped trajectory, thereby greatly increasing the length of the path they follow. By increasing the path that the electrons travel, the likelihood of a given electron interacting with an ionizable gas molecule increases, and thus, the ionization efficiency of the ion source 102 is increased over that of conventional ion sources.

Once ions are generated, they are extracted through the extractor electrode 112. The extractor electrode 112 also helps focus the resulting ion beam onto the target. The dome screen 114 helps to shapes the electric field to aid with extraction and focusing of the ions.

The extractor electrode is biased to be more negative in potential than the front passive cathode electrode 104 so as to draw out the ions. The biasing can be constant or pulsed. If the biasing is pulsed, the radiation generator tube 100 becomes a pulsed radiation generator. In some cases, the cathode grid 106 can be pulsed so as to produce a pulsed radiation. In other cases, the voltages of the front and back passive cathode electrodes 104, 110 may be pulsed so as to produce a pulsed radiation generator.

A suppressor electrode 120 is downstream of the extractor electrode 112. There is a voltage difference between the extractor electrode 112 and the suppressor electrode 120, which may be on the order of 80 kV to 100 kV, such that the electric field in the radiation generator 100 accelerates the ions generated in the ion source 101 downstream toward a target 122. When the ions strike the target 122, neutrons may be generated.

Figure 1A:
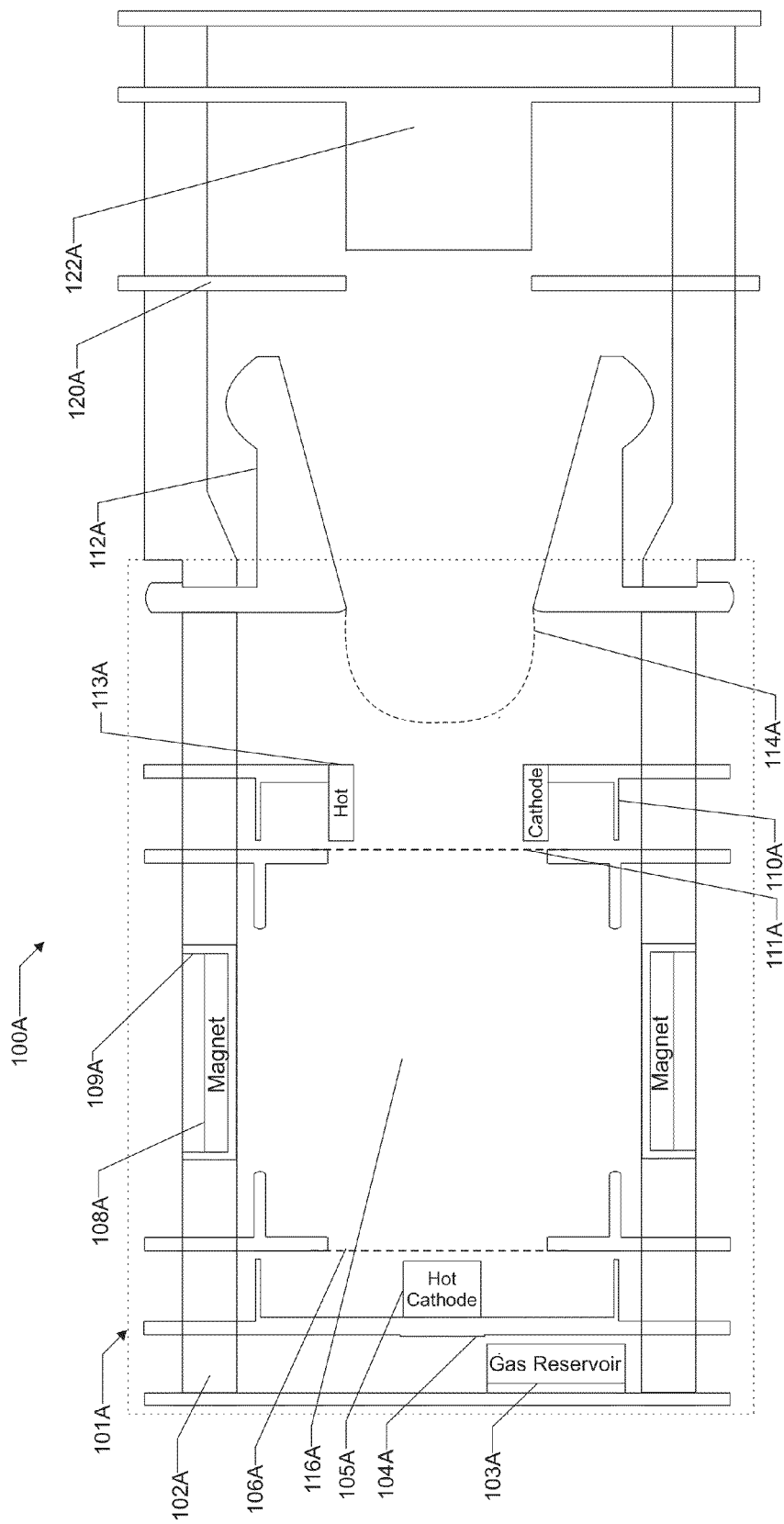
FIG. 1A is a schematic cutaway view of a radiation generator tube employing an ion source with front and back passive cathode electrodes that carry ohmically heated cathodes in accordance with the present disclosure.
Figure 1B:
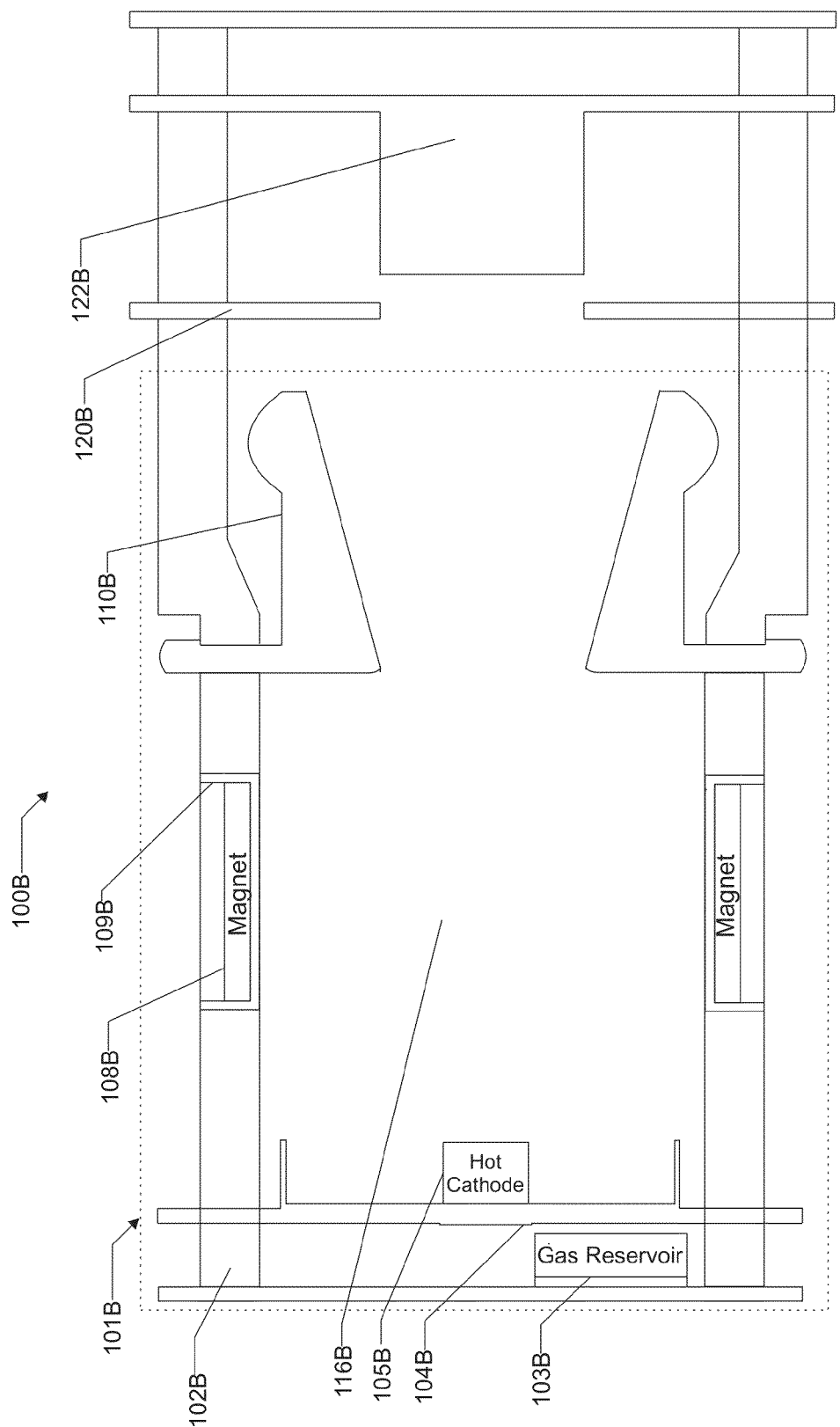
FIG. 1B is a schematic cutaway view of a radiation generator employing an ion source with a back passive cathode electrode carrying an ohmically heated cathode, and with a front passive cathode electrode operating as both an electrode and an extractor electrode, in accordance with the present disclosure.
Figure 1C:
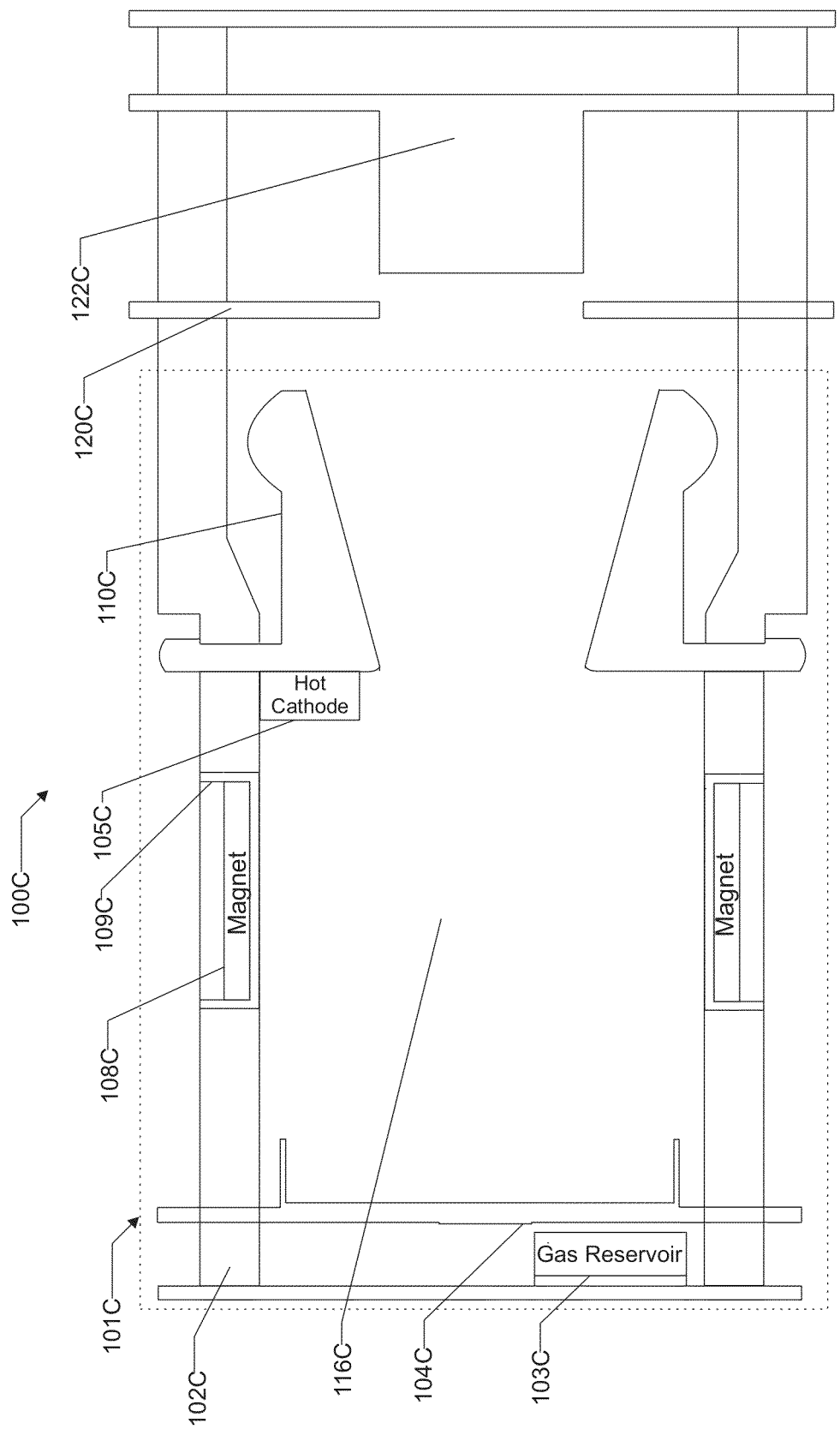
FIG. 1C is a schematic cutaway view of a radiation generator employing an ion source with an ohmically heated cathode, with a front passive cathode electrode operating as both an electrode and an extractor electrode, and with a hot cathode mounted on the front passive cathode electrode carrying the hot cathode, in accordance with the present disclosure.

As shown in FIG. 1A, the front passive cathode electrode 110A may carry a second ohmically heated cathode 113A. Here, the second cathode 113A is ring centered about the longitudinal axis of the ion source 101 so as to allow extraction of the ions from the ionization region 116A. Also, in some applications, a separate/independent extractor electrode 112 need not be present. Indeed, as shown in FIG. 1B, the front passive cathode electrode 110B may serve as both a cathode and extractor electrode. Also, the front passive cathode electrode 110C may carry the ohmically heated cathode 105C, as shown in FIG. 1C.

Figure 2:
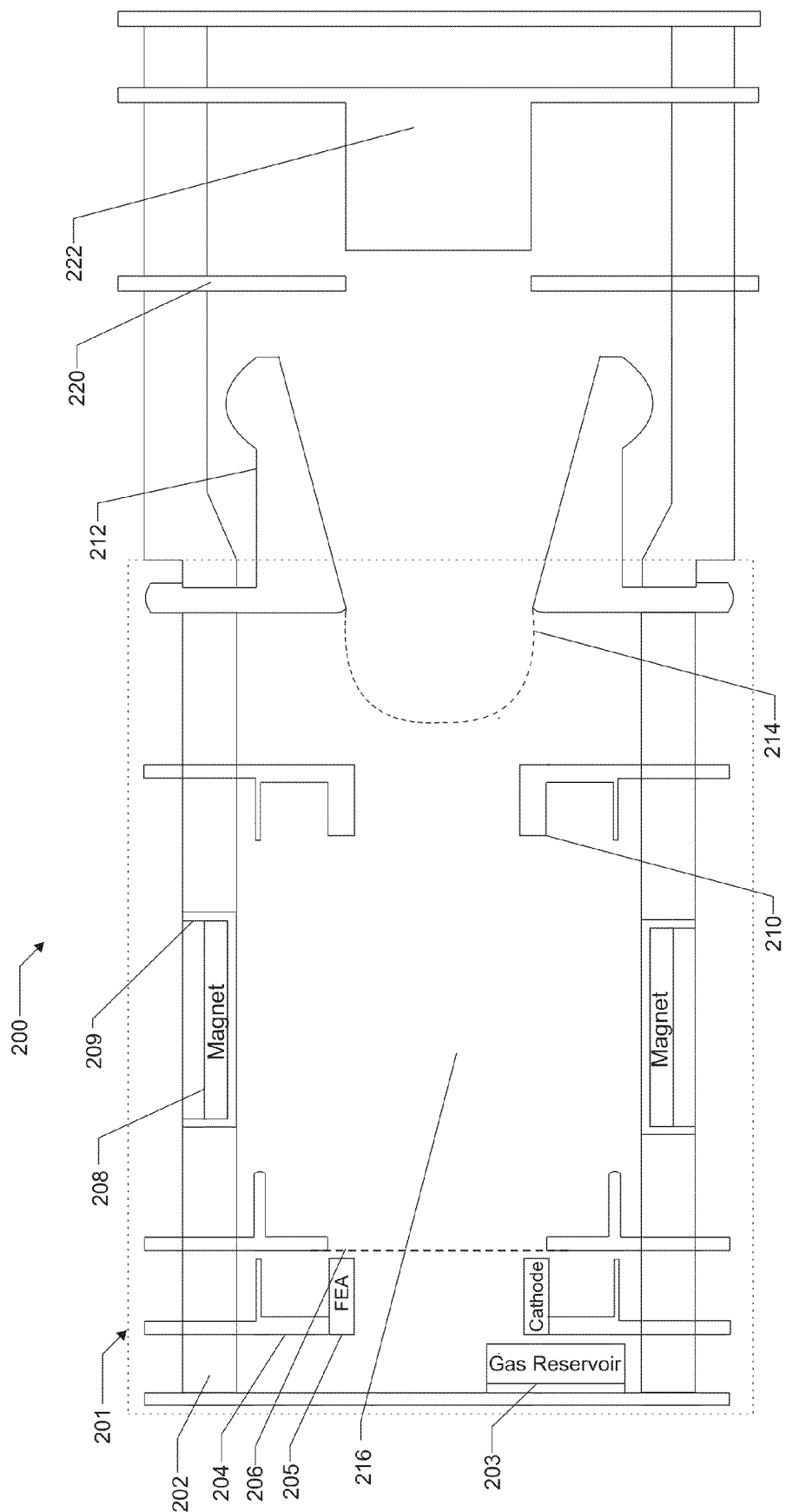
FIG. 2 is a schematic cutaway view of a radiation generator tube employing an ion source with a field emitter array (FEA) cathode in accordance with the present disclosure.
Figure 4:
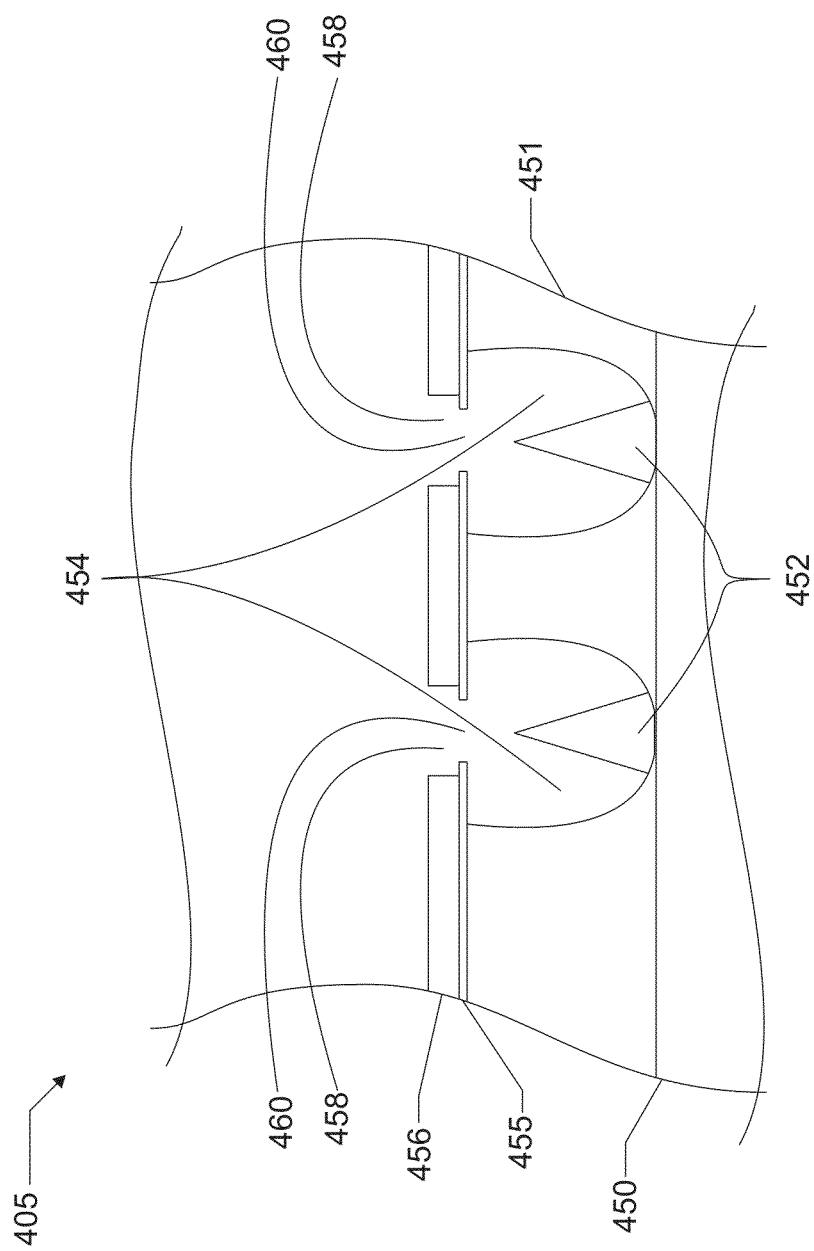
FIG. 4 is a greatly enlarged cross-sectional view of a portion of the cathode of the ion source of FIGS. 2, 2A, 2B, 3.

Another configuration will now be described with reference to FIG. 2. In this radiation generator tube 200, the cathode 205 is a field emitter array (FEA) cathode, such as a Spindt™ cathode. As shown, the FEA cathode is ring centered about the longitudinal axis of the ion source 201, but may take other shapes of course, for example including a button hot cathode positioned away from the longitudinal axis of the ion source 201. Details of the Spindt™ cathode 205 will be explained with reference to FIG. 4. As best shown in FIG. 4, the cathode 405 comprises a substrate 450, supporting an insulating layer 451 having an array of cavities 454 formed therein. Each cavity 454 of the array has a conductive nano-sized projection 452 of an array thereof positioned therein. By nano-sized, it is meant that the projections 452 have a height in a range of 1000 nm to 4000 nm and a diameter at the base in a range of 1000 nm to 2000 nm, for example. The projections 452 may have a generally conical shape, as shown, but may also take other shapes. For example, the projections 452 may be pyramidal, tubular, or rectangular in shape. It should be understood that the projections 452 may be constructed from suitable materials and that in some applications, the projections are not carbon nanotubes. Further details of the FEA cathode 205 need not be given, as those skilled in the art will understand how to select a suitable number of nano-sized projections 452, and the pitch and spacing thereof.

An additional insulating layer 455 is carried by the insulating layer 451. An array of gates 456 comprises a conductive layer supported by the insulating layer 451 and has holes 460 formed therein opposite the tips 452. The insulating layer 455 may have a thickness in the range of 50 nm to 100 nm, and the array of gates 456 may have a thickness in the range of 200 nm to 300 nm, for example. Those skilled in the art will appreciate that these thicknesses may be chosen so as to allow operation of the cathode 404 at specified voltages.

Operation of the ion source 201 will now be described. The array of nano-sized projections 452 and the array of gates 456 have an applied voltage difference such that the resultant electric field causes electrons to be emitted from the nano-sized projections. In particular, due to the shape of the nano-sized projections 452, the electric field is strong enough at the tips of the nano-sized projections that electrons leave the conduction band thereof and enter free space. This process is called field emission. Then, due to the voltage difference between the nano-sized projections 452 and the gates 456, the electrons are accelerated through the gates 456. The voltage difference between the nano-sized projections 452 and the gates 456 may have an absolute value of 200 V, for example, with the nano-sized projections 452 being at ground and with the gates 456 being at +200 V. As an alternative example, the nano-sized projections 452 may be at −200 V and the gates 456 at ground. This voltage difference is chosen such that the emitted electrons have sufficient energy to ionize deuterium and tritium gas, and so as to help ensure a desired number of electrons are produced, and may have an absolute value in the range of 50 to 300 V. It should be appreciated that other voltage differences may be used as well.

In this mode of operation, the cathode grid 206 (optional for some types of FEA cathodes such as Spindt™ cathode) and the cathode 204 have a voltage difference such that the electrons emitted by the cathode 204 are accelerated downstream and toward the extractor electrode 212, and operation proceeds similar to the radiation generator tube 100 described above with reference to FIG. 1. As explained, some applications, the cathode grid 206 may not be present, and the electrons are accelerated to a sufficient hydrogen ionizing energy by the voltage difference between the nano-sized projections 452 and the gates 456, and/or the voltage difference between the nano-sized projections and the anode 209.

Figure 2A:
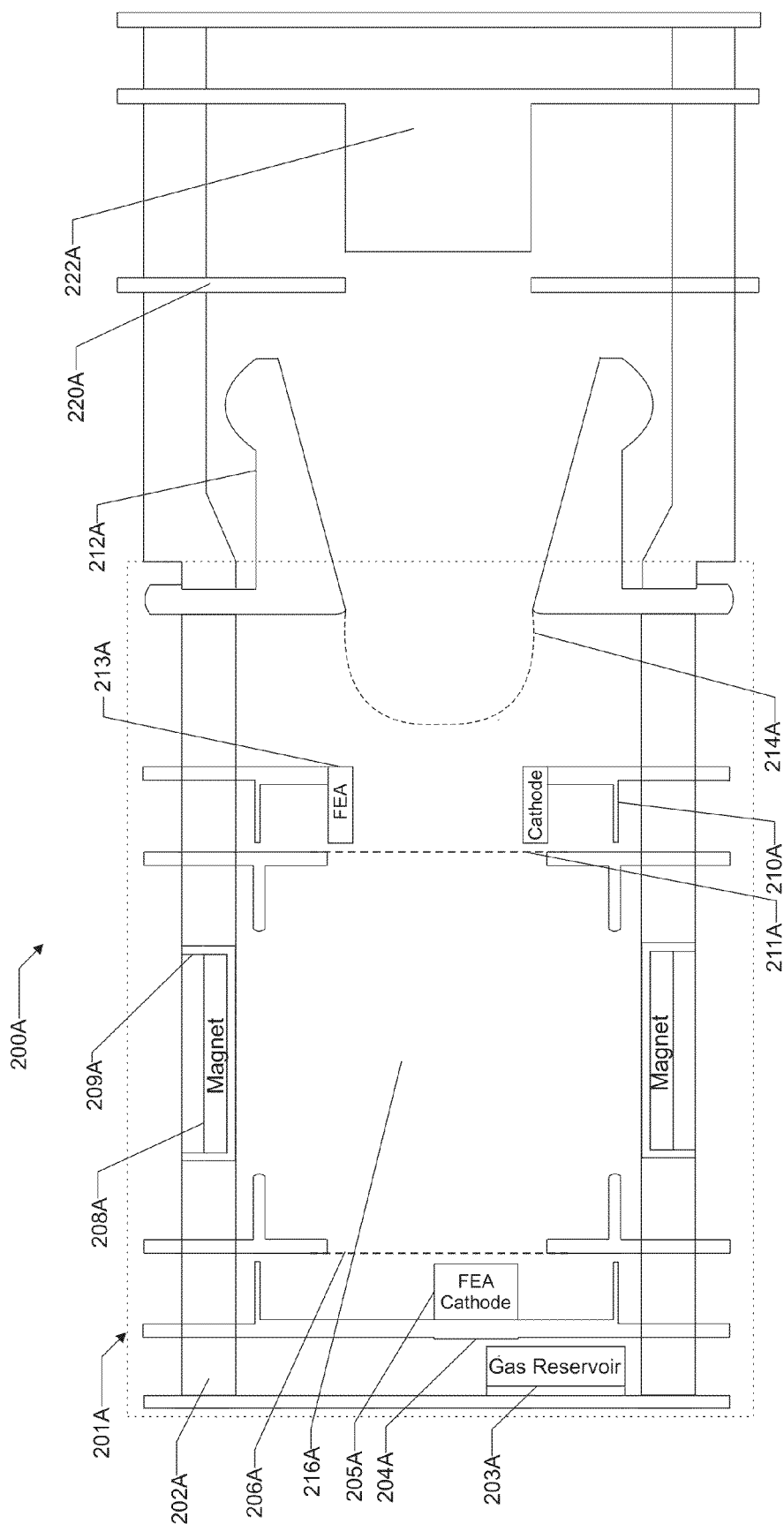
FIG. 2A is a schematic cutaway view of a radiation generator tube employing an ion source with front and back passive cathode electrodes that carry field emitter array cathodes in accordance with the present disclosure.
Figure 2B:
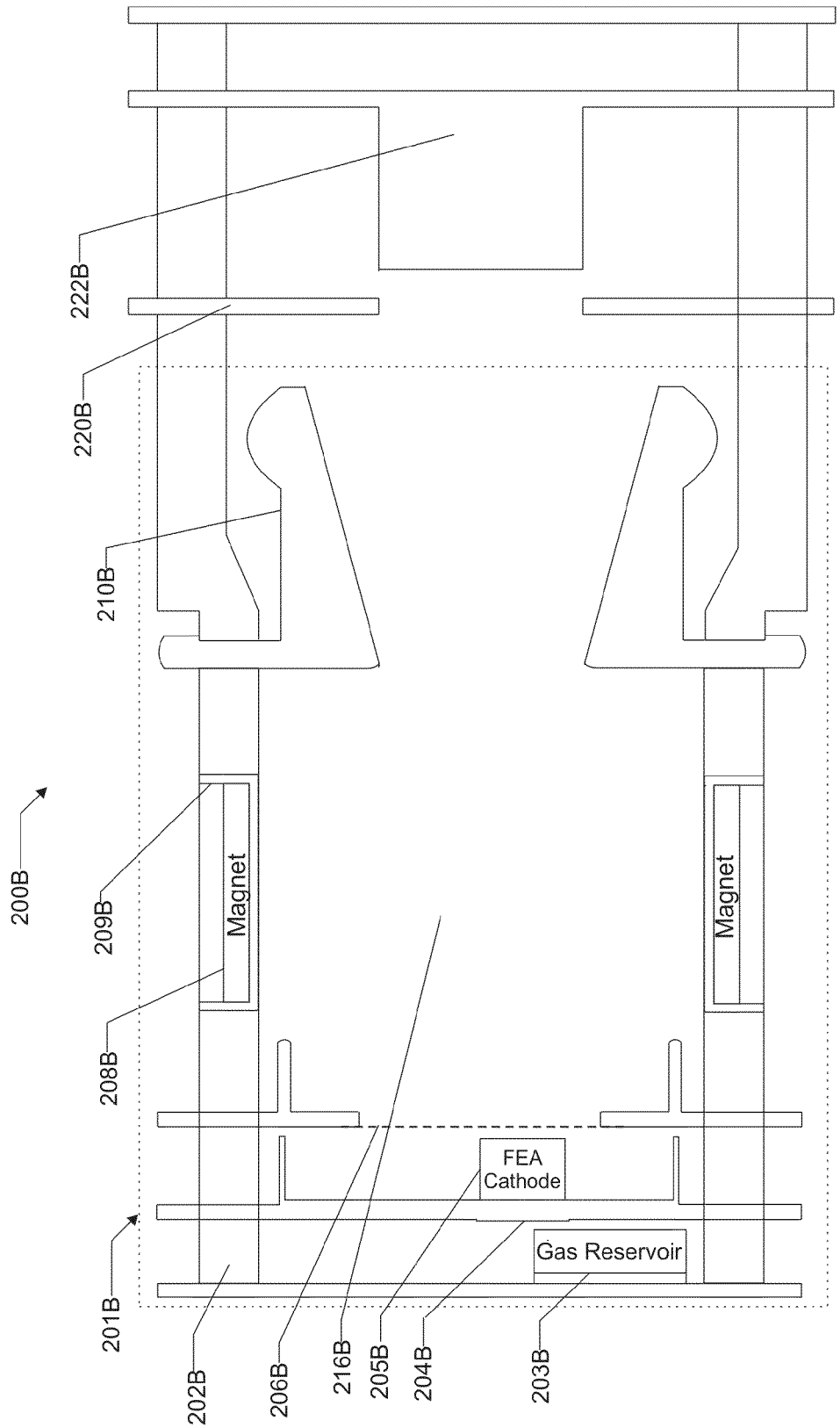
FIG. 2B is a schematic cutaway view of a radiation generator tube employing an ion source with a field emitter array cathode, and with a front "passive" cathode electrode operating as both an electrode and an extractor electrode, in accordance with the present disclosure.

As shown in FIG. 2A, the front passive cathode electrode 110 may carry a second FEA cathode 113. In some applications, as shown in FIG. 2B, the front passive cathode electrode 110 functions as both a cathode electrode and an extractor electrode.

Figure 3:
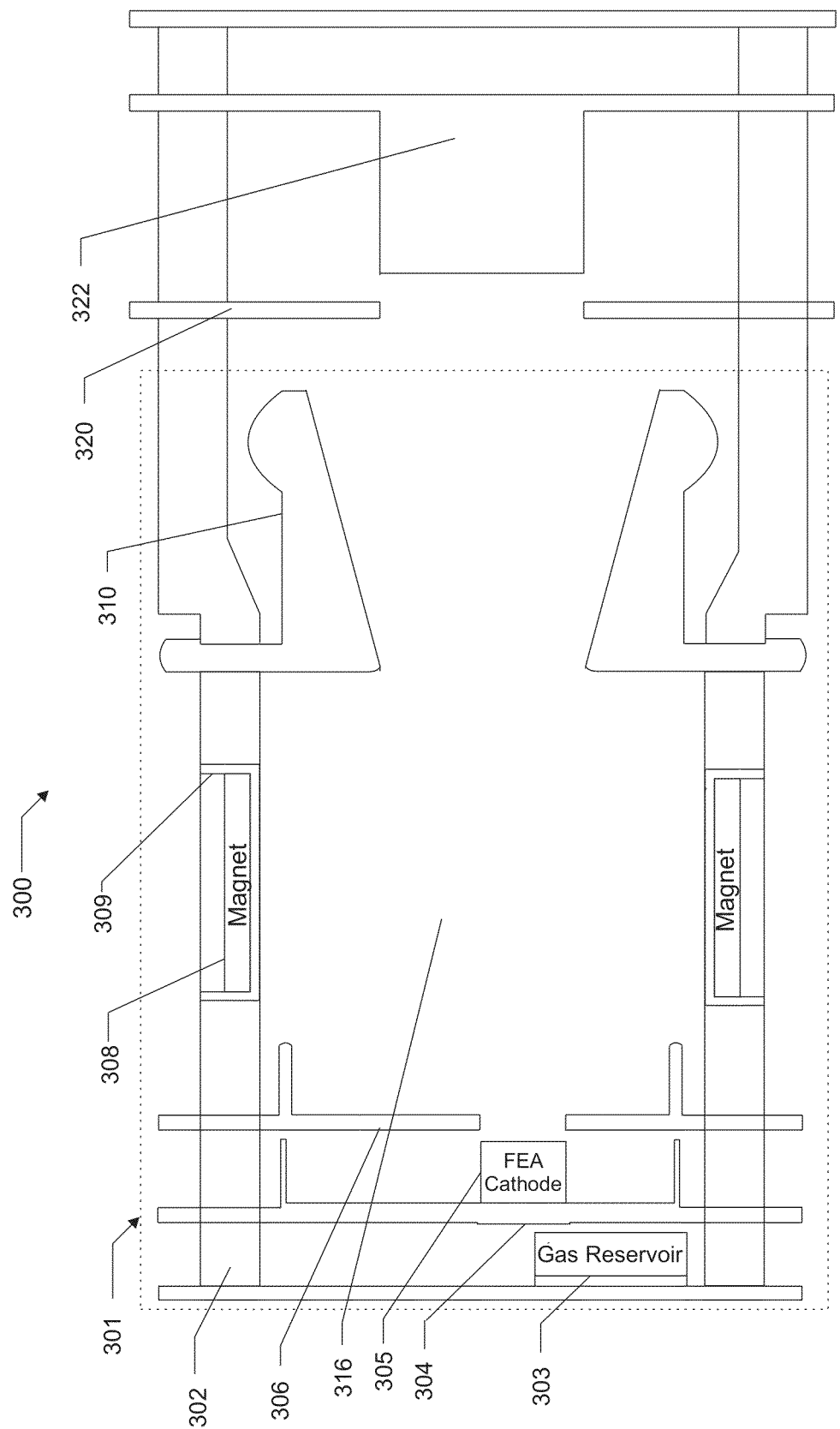
FIG. 3 is a schematic cutaway view of a radiation generator tube employing an alternative application of an ion source with a field emitter array cathode in accordance with the present disclosure.

In another configuration shown in FIG. 3, the grid can be removed and replaced by a puller electrode 306 with an appropriately sized aperture centered about the cathode, and appropriately biased to enable sufficient electrons to be emitted from the FEA for ionization.

Figure 5:
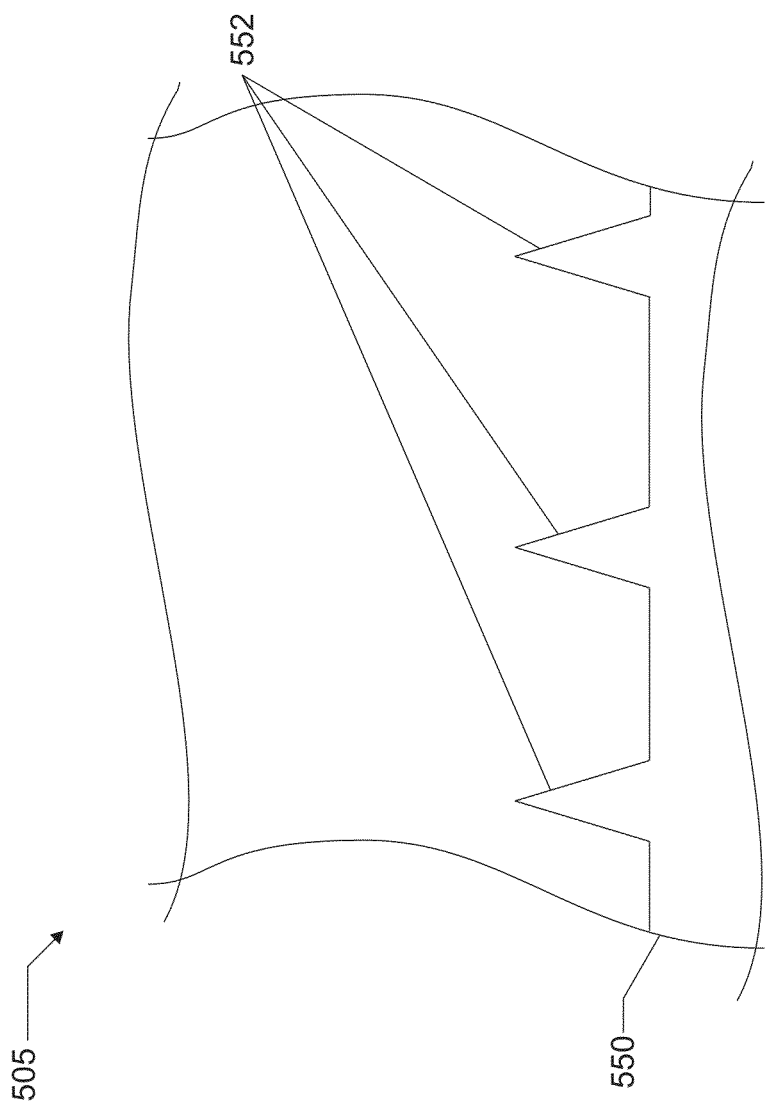
FIG. 5 is a greatly enlarged cross-sectional view of a portion of the cathode of the ion source of FIGS. 2, 2A, 2B, 3.

Here, the FEA cathode 305 is not a Spindt™ cathode, and will now be described with reference to FIG. 5. Here, the FEA cathode 505 comprises an electrically conducting substrate 450, having an array of nano-sized tips 552 formed thereon. By nano-sized, it is meant that the projections 552 have a height in a range of 1000 nm to 4000 nm and a diameter at the base in a range of 1000 nm to 2000 nm, for example. The projections 552 may have a generally conical shape, as shown, but may also take other shapes. For example, the projections 552 may be pyramidal, tubular, or rectangular in shape. It should be understood that the projections 552 may be constructed from suitable materials and that in some applications, the projections are not carbon nanotubes. Operation of the ion source 301 with the FEA cathode 305 involves an electrostatic discharge between either the FEA cathode and the anode electrode 309, or between the FEA cathode and the puller electrode 306. Operation otherwise proceeds as described above, and operation of the radiation generator tube 300 likewise proceeds similar to the radiation generator tube 100 described above with reference to FIG. 1.

Those of skill in the art will note that the FEA cathodes 205A (FIG. 2A), 205B (FIG. 2B), and 305 (FIG. 3) are shown positioned offset to a longitudinal axis of their respective ion sources 201, 201A, 201B, 301. This offset reduces the likelihood of the cathodes 205, 205A, 205B, 305 being struck by backstreaming electrons that may be produced during operation of the radiation generator tube 200, 300. Backstreaming electrons striking any cathodes 205, 205A, 205B, 305 may cause localized heating, which in turn may cause evaporation and/or destruction of cathode material or coat electrical insulator (e.g., 202, 302, etc.) of the hermetic envelope, compromising electrical operation. The evaporated cathode material may also be ionized and accelerated to the target, thereby damaging the target. In addition, the evaporated material may come from the nano-sized projections thereby reducing the sharpness of the nano-sized projections, reducing the electric field at the nano-sized projections and consequently reducing the emission of electrons from the cathode. Lastly, the evaporated material may condense on the insulating layers 451, forming a partially or completely electrically conductive layer leading to the loss of emission of electrons from the cathode.

Figure 6:
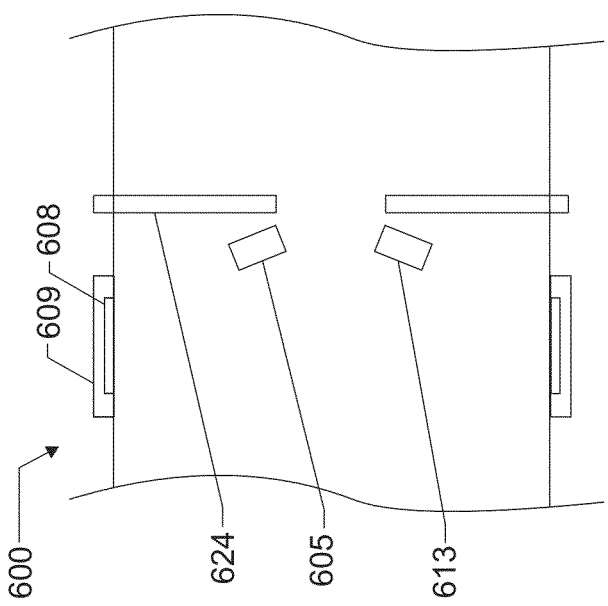
FIG. 6 is a simplified schematic cross-sectional view of an alternative configuration of the ion sources disclosed herein.

Those skilled in the art will appreciate that the cathode(s) of the various ion generators shown above may be positioned in different locations in the ion source than what is shown. For example, as shown in FIG. 6, the cathodes 605, 613 are distributed along the longitudinal axis of the ion source 601. In particular, the cathodes 605, 613 are positioned adjacent the extractor electrode 624, and may be positioned on the circumference of the aperture in the extractor electrode. In this configuration, the cathodes 605, 613 are mounted such that gates are angled away from the longitudinal axis in a range of 0° to 60°, so that they therefore emit electrons upstream into the ionization region (116). This positioning also helps to further guard against adverse effects from backstreaming electrons, and to maximize electron emission area, although this may increase power consumption.

Figure 7:
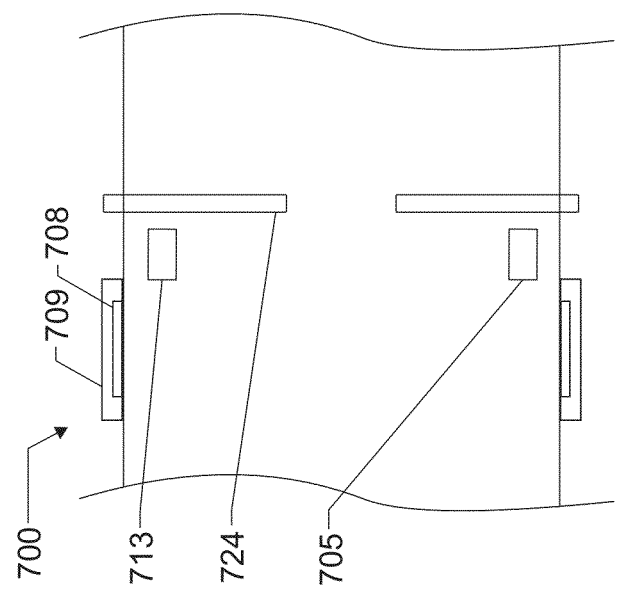

In another application as shown in FIG. 7, the cathodes 705, 713 may be positioned adjacent the insulator. Other configurations are possible—the cathode 705A can be adjacent the insulator, while the cathode 713A is adjacent the extractor as shown in FIG. 7A, or both the cathodes 705A, 713A can be adjacent the insulator as shown in FIG. 7B, for example. As shown in FIG. 7C, there may be three cathodes 705A, 713A, 799A, with the cathode 799A being on one side of the magnet 708A, and the cathodes 705A, 703A being on the other side of the magnet.

It should be appreciated that any of the cathode discussed above may comprise rings centered about the longitudinal axis their respective ion sources. It should also be understood that although feedthroughs and electrical connections for the various components are not shown, the disclosure inherently discloses such. Moreover, it should also be understood that the cathodes discussed above may be aimed so as to dispense electrons at any desired angles. Further, it should also be appreciated there may be multiple cathodes that are different types of cathodes—for example, one may be a hot cathode, while the other may be a FEA cathode.

Figure 8:
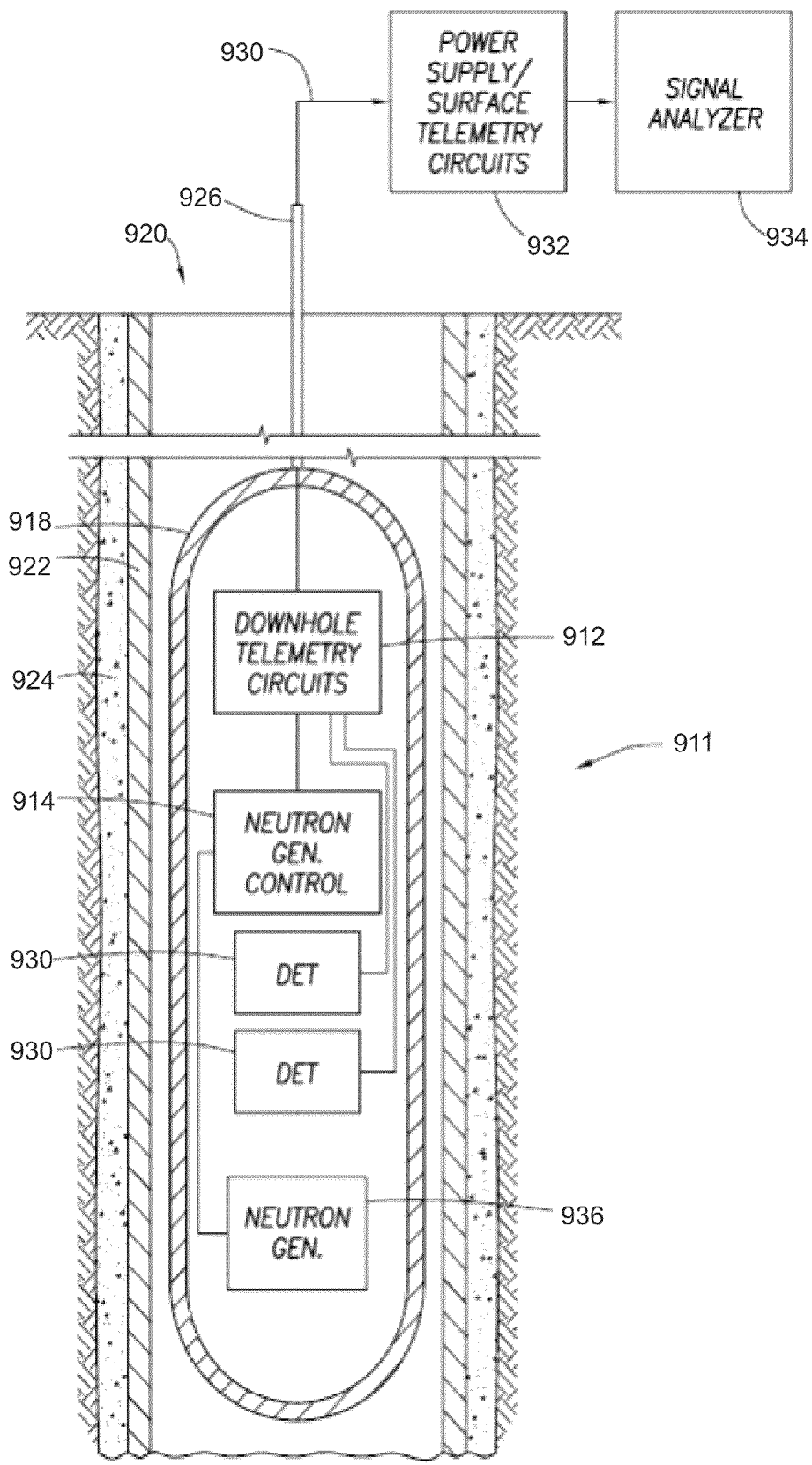
FIG. 8 is a schematic block diagram of a well logging instrument in which the radiation generators disclosed herein may be used.

Turning now to FIG. 8, an example embodiment of a well logging instrument 911 is now described. A pair of radiation detectors 930 are positioned within a sonde housing 918 along with a radiation generator 936 (e.g., as described above) and associated high voltage electrical components (e.g., power supply). The radiation generator 936 employs an ion source in accordance with the present invention and as described above. Supporting control circuitry 914 for the radiation generator 936 (e.g., low voltage control components) and other components, such as downhole telemetry circuitry 912, may also be carried in the sonde housing 918.

The sonde housing 918 is to be moved through a borehole 920. In the illustrated example, the borehole 920 is lined with a steel casing 922 and a surrounding cement annulus 924, although the sonde housing 918 and radiation generator 936 may be used with other borehole configurations (e.g., open holes). By way of example, the sonde housing 918 may be suspended in the borehole 920 by a cable 926, although a coiled tubing, etc., may also be used. Furthermore, other modes of conveyance of the sonde housing 918 within the borehole 920 may be used, such as wireline, slickline, and logging while drilling (LWD), for example. The sonde housing 918 may also be deployed for extended or permanent monitoring in some applications.

A multi-conductor power supply cable 930 may be carried by the cable 926 to provide electrical power from the surface (from power supply circuitry 932) downhole to the sonde housing 918 and the electrical components therein (i.e., the downhole telemetry circuitry 912, low-voltage radiation generator support circuitry 914, and one or more of the above-described radiation detectors 930). However, in other configurations power may be supplied by batteries and/or a downhole power generator, for example.

The radiation generator 936 is operated to emit neutrons to irradiate the geological formation adjacent the sonde housing 918. Gamma-rays that return from the formation are detected by the radiation detectors 930. The outputs of the radiation detectors 930 are communicated to the surface via the downhole telemetry circuitry 912 and the surface telemetry circuitry 932 and may be analyzed by a signal analyzer 934 to obtain information regarding the geological formation. By way of example, the signal analyzer 934 may be implemented by a computer system executing signal analysis software for obtaining information regarding the formation. More particularly, oil, gas, water and other elements of the geological formation have distinctive radiation signatures that permit identification of these elements. Signal analysis can also be carried out downhole within the sonde housing 918 in some embodiments.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An ion source for use in a radiation generator tube comprising:
   a back passive cathode electrode;
   a passive anode electrode downstream of the back passive cathode electrode;
   a magnet adjacent the anode;
   a front passive cathode electrode downstream of the passive anode electrode, the front passive cathode electrode and the back passive cathode electrode defining an ionization region therebetween;
   at least one field emitter array (FEA) cathode, spaced apart from the back passive cathode electrode, the passive anode electrode, and the front passive cathode electrode, and configured to electrostatically discharge due to an electric field in the ion source;
   the back passive cathode electrode and the passive anode electrode, and the front passive cathode electrode and the passive anode electrode, having respective voltage differences therebetween, and the magnet generating a magnetic field, such that a Penning-type trap is produced to confine electrons from the electrostatic discharge to the ionization region;
   at least some of the electrons in the ionization region interacting with an ionizable gas to create ions.

2. The ion source of claim 1, wherein the electrostatic discharge is between the at least one FEA cathode and the passive anode electrode.

3. The ion source of claim 1, further comprising a puller electrode downstream of the at least one FEA cathode, the puller electrode having an opening formed therein; and wherein the electrostatic discharge is between the at least one FEA cathode and the puller electrode.

4. The ion source of claim 1, wherein the at least one FEA cathode comprises a ring.

5. The ion source of claim 1, wherein the at least one FEA cathode comprises a plurality thereof.

6. The ion source of claim 1, further comprising an extractor electrode downstream of the front passive cathode electrode.

7. The ion source of claim 1, wherein the at least one FEA cathode comprises:
   an electrically conductive substrate; and
   an array of nano-sized projections carried by the electrically conductive substrate.

8. The ion source of claim 1, wherein the magnet comprises a permanent magnet or an electromagnet.

9. The ion source of claim 1, wherein the electric field results in the electrons having an energy sufficient to ionize hydrogen, deuterium or tritium gas.

10. The ion source of claim 1, wherein the at least one FEA cathode is positioned offset to a longitudinal axis of the ion source.

11. A well logging instrument comprising:
    a sonde housing;
    a radiation generator tube carried by the sonde housing and comprising
    an ion source comprising
    a back passive cathode electrode;
    a passive anode electrode downstream of the back passive cathode electrode;
    a magnet adjacent the anode;
    a front passive cathode electrode downstream of the passive anode electrode, the front passive cathode electrode and the back passive cathode electrode defining an ionization region therebetween;
    at least one field emitter array (FEA) cathode, spaced apart from the back passive cathode electrode, the passive anode electrode, and the front passive cathode electrode, and configured to electrostatically discharge due to an electric field in the ion source;
    the back passive cathode electrode and the passive anode electrode, and the front passive cathode electrode and the passive anode electrode, having respective voltage differences therebetween, and the magnet generating a magnetic field, such that a Penning-type trap is produced to confine electrons from the electrostatic discharge to the ionization region;
    at least some of the electrons in the ionization region interacting with an ionizable gas to create ions;
    a suppressor electrode downstream of the ion source; and
    a target downstream of the suppressor electrode;
    the suppressor electrode having a potential such that a resultant electric field between the front passive cathode electrode and suppressor electrode accelerates the ions generated by the ion source toward the target.

12. The well logging instrument of claim 11, further comprising a puller electrode downstream of the at least one FEA cathode, the puller electrode having an opening formed therein; and wherein the electrostatic discharge is between the at least one FEA cathode and the puller electrode.

13. The well logging instrument of claim 11, wherein the at least one FEA cathode comprises a plurality thereof.

14. The well logging instrument of claim 11, further comprising an extractor electrode downstream of the front passive cathode electrode.

15. The well logging instrument of claim 11, wherein the at least one FEA cathode comprises:
    an electrically conductive substrate; and
    an array of nano-sized projections carried by the electrically conductive substrate.

16. An ion source for use in a radiation generator comprising:
    a gas reservoir to emit an ionizable gas;
    at least one field emitter array (FEA) cathode to emit electrons; and
    a penning device to confine the electrons in a penning-style trap; and
    at least some of the electrons in the penning-style trap interacting with the ionizable gas to thereby generate ions;
    wherein the penning device comprises a back passive cathode electrode, a passive anode electrode downstream of the back passive cathode electrode, a magnet adjacent the passive anode electrode, and a front passive cathode electrode downstream of the passive anode electrode; and
    wherein the at least one FEA cathode is spaced apart from the back passive cathode electrode, the passive anode electrode, and the front passive cathode electrode.

17. A method of operating an ion source having a back passive cathode electrode, a passive anode electrode downstream of the back passive cathode electrode, a magnet adjacent the anode, a front passive cathode electrode downstream of the anode, and at least one field emitter array (FEA) cathode spaced apart from the back passive cathode electrode, the passive anode electrode, and the front passive cathode electrode, the method comprising:
 generating an electric field such that the at least one FEA cathode electrostatically discharges;
 producing a Penning-type trap to confine the electrons to the ionization region by generating respective voltage differences between the back passive cathode electrode and the passive anode electrode, and the front passive cathode electrode and the anode, and by generating a magnetic field with the magnet; and
 generating ions via interactions between at least some of the electrons and an ionizable gas as the electrons travel in the ionization region.

18. The method of claim 17, further comprising accelerating the ions out of the ion source using an extractor electrode downstream of the front passive cathode electrode.

19. The method of claim 17, wherein the at least one FEA cathode comprises a plurality thereof.

20. The method of claim 17, wherein the at least one FEA cathode comprises:
 an electrically conductive substrate; and
 an array of nano-sized projections carried by the electrically conductive substrate.

* * * * *